United States Patent [19]
Choi et al.

[11] Patent Number: 5,824,438
[45] Date of Patent: Oct. 20, 1998

[54] STRUCTURE OF PHASE SHIFTING MASK AND METHOD OF MANUFACTURING THE SAME COMPRISING AN ADHESIVE LAYER BETWEEN A PHASE SHIFT LAYER AND A LIGHT BLOCKING LAYER

[75] Inventors: Yong-Kyoo Choi, Chungcheongbuk-do; Chan-Min Park, Pusan-si; Jun-Seok Lee, Seoul, all of Rep. of Korea

[73] Assignee: LG Semicon Co., Ltd., Cheongju, Rep. of Korea

[21] Appl. No.: 791,577

[22] Filed: Jan. 31, 1997

[30] Foreign Application Priority Data

Jul. 31, 1996 [KR] Rep. of Korea ............... 31662/1996

[51] Int. Cl.⁶ .................................................. G03F 9/00
[52] U.S. Cl. ................................................................ 430/5
[58] Field of Search ................................. 430/5, 322, 324, 430/313, 314

[56] References Cited

U.S. PATENT DOCUMENTS

| | | | |
|---|---|---|---|
| 5,356,738 | 10/1994 | Inoue et al. | 430/5 |
| 5,582,939 | 12/1996 | Pierrat | 430/5 |
| 5,656,397 | 8/1997 | Imai et al. | 430/5 |

OTHER PUBLICATIONS

Lin, B.J., "Phase–Shifting and Other Challenges in Optical Mask Technology," BACUS, vol. 7, Issue 1, Feb. 1, 1991.
Levensen, M.C., et al., "Improving Resolution in Photolithography with a Phase–Shifting Mask," IEEE Transactions on Electron Devices, vol. ED 29, No. 12.
Pierrat, C. et al., "Phase–Shifting Mask Topography Effects on Lithographic Image Quality," IEEE, 1992.

*Primary Examiner*—S. Rosasco
*Attorney, Agent, or Firm*—Fleshner & Kim

[57] ABSTRACT

The structure of a phase shift mask and a method of manufacturing the same are disclosed. A phase shifting mask in accordance with the present invention comprises a light transmitting substrate, a phase shifting layer formed on the upper side of the light transmitting substrate, an adhesive layer formed on the phase shifting layer, and a light shielding layer formed on the adhesive layer. Accordingly, when etching the phase shifting layer, the light shielding layer is protected by the adhesive layer. The adhesive strength is increased due to the adhesive layer formed between the phase shifting layer and the light shielding layer, thereby much improving the reliability of the phase shifting mask.

40 Claims, 8 Drawing Sheets

F I G.5
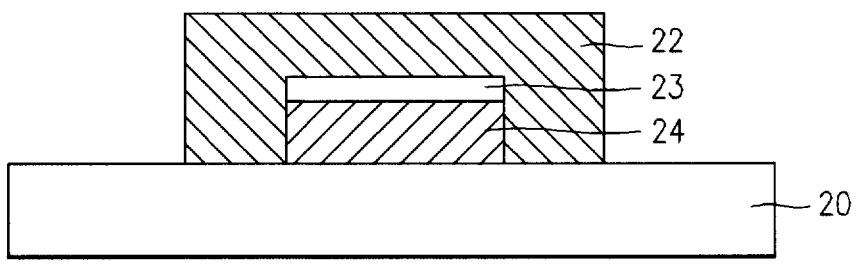

F I G.7
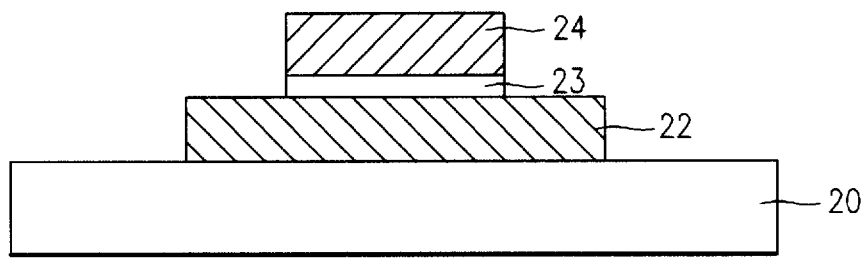

F I G.8a
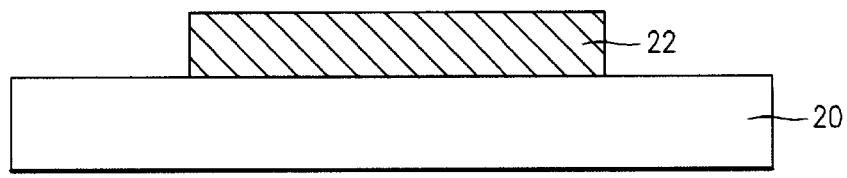
F I G.8b
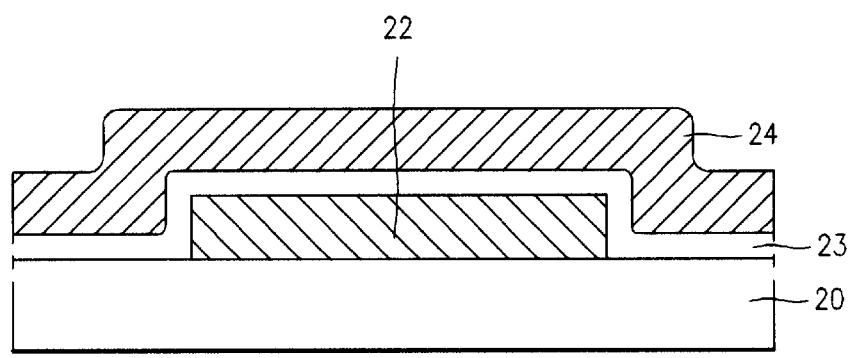
F I G.8c
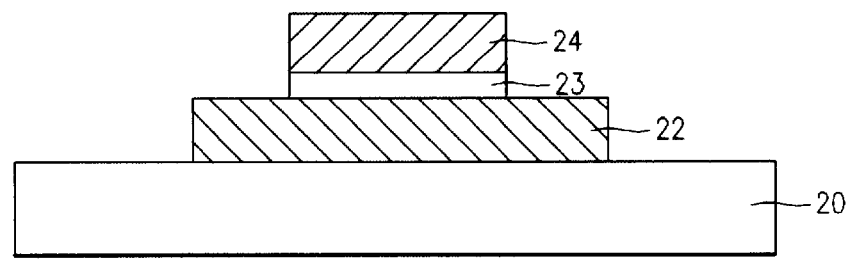

STRUCTURE OF PHASE SHIFTING MASK AND METHOD OF MANUFACTURING THE SAME COMPRISING AN ADHESIVE LAYER BETWEEN A PHASE SHIFT LAYER AND A LIGHT BLOCKING LAYER

BACKGROUND OF THE INVENTION

1. Field of the Invention

The present invention relates to mask manufacture, and more particularly, to the structure of a mask utilizing a phase shift and a method of manufacturing such a mask.

2. Background of the Related Art

As the integration of semiconductor devices increases and the package density becomes higher, photomasks with a fine line-width are required. Further, reports of special transmutative manufacturing techniques are now being published.

In general, photolithography is a technique where the light of certain wavelengths, such as in the ultraviolet range, is transmitted through a photomask to the surface of a photoresist coated on a semiconductor substrate, thereby forming an image pattern. Generally, a photomask is composed of a specific pattern of a transparent (or light transmitting) pattern and an opaque (or light non-transmitting) pattern, which results in selective exposure of the photoresist. However, diffraction occurs due to the increase in pattern density, thereby limiting the improvement in resolution.

Accordingly, processes utilizing a phase shifting mask to improve the resolution have been studied in various fields. A phase shifting mask modulates the phase of light passing through a phase shift transmitting layer by 180°, thereby causing an offset-interference with the light passing through a general transmitting layer. Therefore, as compared to an ordinary mask, a phase shifting mask can improve resolving power and depth of focus.

Phase shifting masks (PSMs) are of various types, for example, alternating phase shifting mask (PSM), attenuating PSM, RIM-type PSM, out-rigger type PSM, etc. Methods of manufacturing a phase shifting mask in accordance with prior art methods will be described with reference to FIGS. 1a–1e and FIGS. 2a–2d of the attached drawings below.

FIGS. 1a–1e are cross-sectional views which illustrate a first prior art method of manufacturing a phase shifting mask. As shown in FIG. 1a, a layer 2 of chromium which provides shade from the light, is deposited on a transparent substrate 1 and layer 2 is selectively removed, thereby forming patterns in chromium layer 2. As shown in FIG. 1b, a photosensitive film 3 is coated on the entire surface of transparent substrate 1 and patterned chromium layer 2 and then photosensitive film 3 is selectively removed, thereby forming shifter patterns. The shifter patterns are aligned with the pattern in chromium layer 2. As shown in FIG. 1c, using the chromium layer pattern and photosensitive film 3 as a mask, transparent substrate 1 is first etched to a predetermined depth by reactive ion etching RIE). As shown in FIG. 1d, using patterned chromium layer 2 and photosensitive film 3 as a mask, etched transparent substrate 1 is etched a second time. This second etching is performed by isotropic etching using a wet etchant, such as a solution of NaOH. As shown in FIG. 1e, the remaining photosensitive film 3 is then removed to complete a phase shifting mask.

FIGS. 2a–2d are cross-sectional views illustrating a second prior art method of manufacturing a phase shifting mask. As shown in FIG. 2a, a phase shifting layer 11 and a light shielding layer 12 are sequentially deposited on a transparent substrate 10. As shown in FIG. 2b, by means of photolithography and an etching process, light shielding layer 12 is selectively removed to expose phase shifting layer 11. As shown in FIG. 2c, a photosensitive film 13 is coated on the entire surface of phase shifting layer 11 and light shielding layer 12, and photosensitive film 13 is then selectively removed, thereby forming shifter patterns. The shifter patterns are aligned with the pattern of light shielding layer 12. As shown in FIG. 2d, using patterned light shielding layer 12 and photosensitive film 13 as a mask, exposed phase shifting layer 11 is etched. Then, the remainder of photosensitive film 13 is removed to complete a phase shifting mask.

In the method of manufacturing a phase shifting mask in accordance with the first prior art method, the following problems exist. First, when etching the transparent substrate under the chromium layer, the dry etching and the wet etching are mixed, which results in complications in the process. Second, only a phase difference of 180° must exist between the light passing through the shifter region and the light passing through the transparent substrate excluding the shifter region, with the same intensity of light. However, a problem of phase uniformity is caused when the transparent substrate is wet-etched. Thus, the phase deviation becomes severe and the resolving power is effectively reduced.

Various problems also exist in the second prior art method of manufacturing a phase shifting mask. For example, when wet etching is carried out, the phase shifting layer and the light shielding layer tend to become separated from each other due to poor adhesive strength between the two layers. As a result, cracks may be generated on the surface of the phase shifting layer. Further, when wet-etching the phase shifting layer, the substrate may be inadvertently etched due to a lack of etch selectivity between the phase shifting layer and the substrate. Consequently, the roughness of the etched substrate surface may be an issue. Moreover, the edge of the light shielding layer located on the etched phase shifting layer may be easily damaged.

SUMMARY OF THE INVENTION

Accordingly, the present invention is directed to the structure of a phase shifting mask and a method of manufacturing the same that substantially obviates one or more of the problems, limitations, and disadvantages of the prior art.

An object of the present invention is to provide a phase shifting mask with improved reliability.

Another object of the present invention is to provide a phase shifting mask with improved light transmittance.

To achieve these and other advantages and in accordance with the purpose of the present invention, as embodied and broadly described, there is provided a phase shifting mask comprising a light transmitting substrate, a phase shifting layer formed on the light transmitting substrate, an adhesive layer formed on the phase shifting layer, and a light shielding layer formed on the adhesive layer.

Further, the phase shifting layer may comprise a material selected from the group consisting of an oxide, a spin-on-glass (SOG), and a diamond-like carbon DLC). The adhesive layer is comprised of a material whose etch rate is different from that of the phase shifting layer. The phase shifting layer may be formed to a width wider than that of the light shielding layer.

The present invention may be also achieved in whole or part by a phase shifting mask, comprising a light transmitting substrate; a substrate protecting layer formed on the light transmitting substrate; a phase shifting layer formed on the substrate protecting layer, the phase shifting layer having an open region therein, and the open region having first and second edge parts; first and second portions of an adhesive layer formed on the phase shifting layer, the first and second portions of the adhesive layer extending over the first and second edge parts, respectively, of the open region; and first and second portions of a light shielding layer formed on the first and second portions of the adhesive layer.

The present invention can be achieved by a phase shifting mask, comprising: a light transmitting substrate; a light shielding layer formed on the light transmitting substrate, the light shielding layer having a predetermined width; an adhesive layer formed on the light shielding layer; and a phase shifting layer formed so as to surround the entire exposed surfaces of the light shielding layer and the adhesive layer.

Alternatively, the present invention may be achieved in part or whole by a method of manufacturing a phase shifting mask, comprising the steps of: preparing a transmitting substrate; sequentially forming a substrate protecting layer, a phase shifting layer, an adhesive layer and a light shielding layer on the substrate; patterning the light shielding layer and the adhesive layer to form a plurality of patterns spaced apart from one another; and patterning the phase shifting layer to form a plurality of phase shifting layer patterns.

A method of manufacturing a phase shifting mask can also comprise the steps of: preparing a transmitting substrate; sequentially forming a light shielding layer and an adhesive layer on the substrate; patterning the light shielding layer and the adhesive layer to form a pattern with a predetermined width; forming a phase shifting layer on the entire surface of the substrate including the pattern; and patterning the phase shifting layer to form a phase shifting layer pattern surrounding the exposed entire surface of the pattern.

The present invention may be achieve in part or in whole by a method of manufacturing a phase shifting mask, comprising the steps of: preparing a transmitting substrate; forming a phase shifting layer on the substrate; patterning the phase shifting layer to form a pattern with a predetermined width; sequentially forming an adhesive layer and a light shielding layer on the entire surface of the substrate including the pattern; and patterning the adhesive layer and the light shielding layer so as to have a width smaller than that of the phase shifting layer.

The method may be also achieved by a method of manufacturing a phase shifting mask, comprising the steps of: providing a light transmitting substrate; sequentially forming a substrate protecting layer, a phase shifting layer, an adhesive layer, and a light shielding layer on the light transmitting substrate; selectively removing the light shielding layer and the adhesive layer to form a pattern within the light shielding layer and the adhesive layer, wherein the pattern within the light shielding layer and the adhesive layer comprises first and second portions of the light shielding layer and of the adhesive layer; and selectively removing the phase shifting layer to form a pattern in the phase shifting layer.

The present invention may be also achieved in part or in whole by a method of manufacturing a phase shifting mask, comprising the steps of: providing a light transmitting substrate; sequentially forming a light shielding layer and an adhesive layer on the light transmitting substrate; selectively removing the light shielding layer and the adhesive layer to form a light shielding layer and adhesive layer pattern having a predetermined width; forming a phase shifting layer on the entire surfaces of the light transmitting substrate and the light shielding layer and adhesive layer pattern; and selectively removing the phase shifting layer to form a phase shifting layer pattern, wherein the phase shifting layer pattern surrounds the entire exposed surfaces of the light shielding layer and adhesive layer pattern.

The invention can be achieved also by a method of manufacturing a phase shifting mask, comprising the steps of: providing a light transmitting substrate; sequentially forming a light shielding layer and an adhesive layer on the light transmitting substrate; selectively removing the light shielding layer and the adhesive layer to form a light shielding layer and adhesive layer pattern having a predetermined width; forming a phase shifting layer on the entire surfaces of the light transmitting substrate and the light shielding layer and adhesive layer pattern; and selectively removing the phase shifting layer to form a phase shifting layer pattern, wherein the phase shifting layer pattern surrounds the entire exposed surfaces of the light shielding layer and adhesive layer pattern.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 5 is a cross-sectional view showing the structure of a phase shifting mask in accordance with a second embodiment of the present invention;

FIG. 7 is a cross-sectional view showing the structure of a phase shifting mask in accordance with a third embodiment of the present invention; and FIGS. 8a–8c are cross-sectional views illustrating a method of manufacturing a phase shifting mask in accordance with the third embodiment of the present invention.

DETAILED DESCRIPTION OF PREFERRED EMBODIMENTS

Figure 1A:
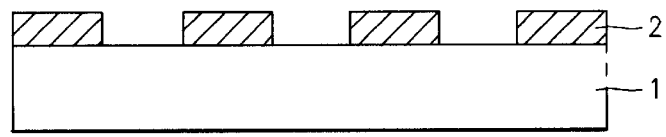
FIGS. 1a–1e are cross-sectional views illustrating a method of manufacturing a phase shifting mask in accordance with a first prior art method.
Figure 1B:
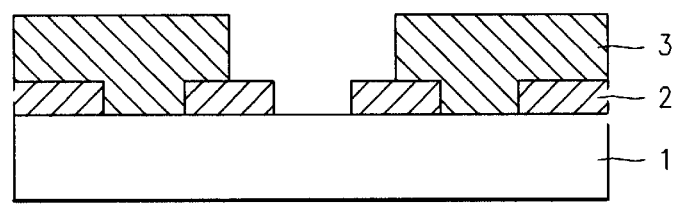
Figure 1C:
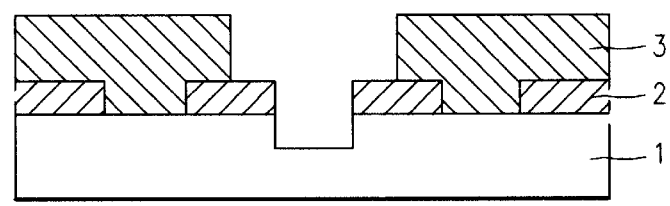
Figure 1D:
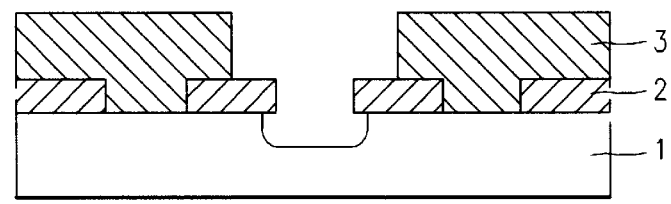
Figure 1E:
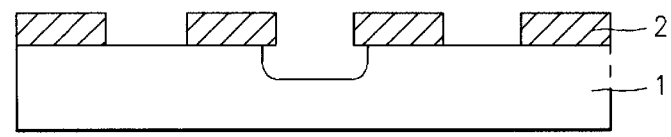
Figure 2A:
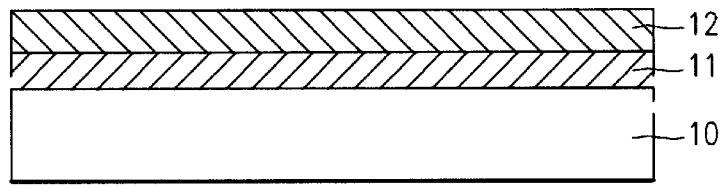
FIGS. 2a–2d are cross-sectional views illustrating a method of manufacturing a phase shifting mask in accordance with a second prior art method.
Figure 2B:
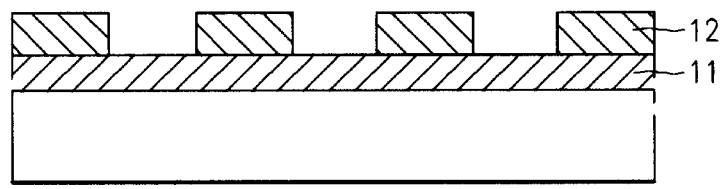
Figure 2C:
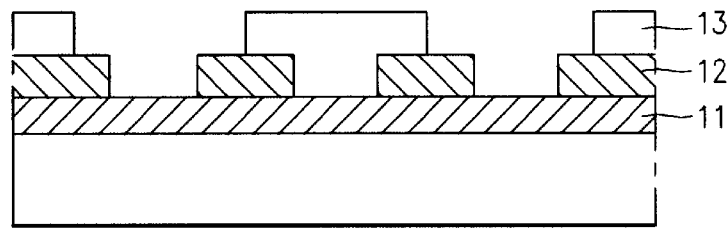
Figure 2D:
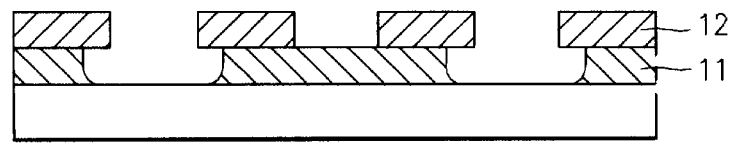
Figure 3:
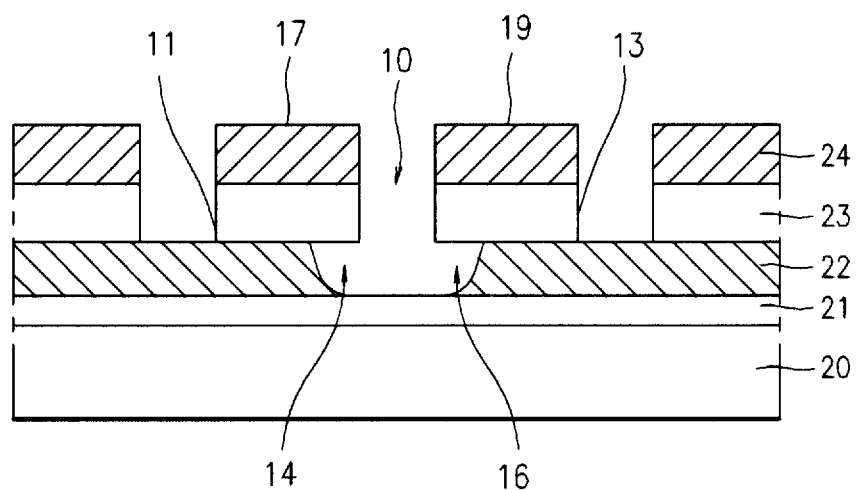
FIG. 3 is a cross-sectional view showing the structure of a phase shifting mask in accordance with a first embodiment of the present invention.

FIG. 3 is a cross-sectional view showing the structure of a phase shifting mask in accordance with a first embodiment of the present invention. The phase shifting mask of the present invention includes a transparent substrate 20; a substrate protecting layer 21, formed on transparent substrate 20; a phase shifting layer 22, formed on substrate protecting layer 21, and having an open region 10; an adhesive layer 23, formed on phase shifting layer 22, and including first and second portions 11, 13 of adhesive layer 23 extending over first and second edge parts 14, 16, respectively, of the open region 10 of phase shifting layer 22; and light shielding layer 24, formed on adhesive layer. 23, and including first and second portions 17, 19 of light shielding layer 24 aligned with the first and second portions of phase shifting layer 22.

Substrate protecting layer 21 may comprise either $SnO_2$ or SiN, both of which transmit light and have an etch-resistance to an SOG etchant. Phase shifting layer 22 comprises a material selected from the group of an oxide, an SOG, and a DLC; all of which are materials having low light-absorptivity and with which low temperature deposition is possible. If the thickness of phase shifting layer 22 is D, it is formed so as to satisfy the formula: $D=\lambda/2\cdot(n-1)$; wherein $\lambda$ is the exposure wavelength, and n is the refractive index of phase shifting layer 22.

Adhesive layer 23 comprises a material selected from the group of SiN, TiN, and TiW; all of which have a different etch rate than that of phase shifting layer 22. Light shielding layer 24 is comprised of chromium. Light shielding layer 24 and adhesive layer 23 are formed so that they are aligned with each other. Phase shifting layer 22 is removed by isotropic etching. The amount of isotropic etching of phase shifting layer 22 is the amount of time required to etch light shielding layer 24 to under half of the width of light shielding layer 24 and adhesive layer 23.

Figure 4A:
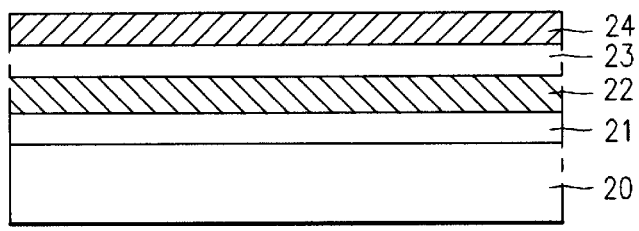
FIGS. 4a–4e are cross-sectional views illustrating a method of manufacturing a phase shifting mask in accordance with the first embodiment of the present invention.

FIGS. 4a–4e are cross-sectional views illustrating a method of manufacturing a phase shifting mask according to the first embodiment of the present invention. As shown in FIG. 4a, a substrate protecting layer 21, a phase shifting layer 22, an adhesive layer 23, and a light shielding layer 24 are sequentially formed on a transparent substrate 20 such as quartz or glass. Substrate protecting layer 21 is comprised of either $SnO_2$ or SiN, which are materials transmitting light and are etch-resistant to an SOG etchant. Phase shifting layer 22 is comprised of a material selected from the group of an oxide, an SOG, and a DLC; all of which are materials having low light-absorptivity, and for which low temperature deposition is possible.

If the thickness of phase shifting layer 22 is D, it is formed so as to satisfy the formula: $D=\lambda/2\cdot(n-1)$, wherein $\lambda$ is the exposure wavelength, and n is the refractive index of phase shifting layer 22. Adhesive layer 23 is comprised of a material selected from the group of SiN, TiN, and TiW, all of which have a different etch rate than that of phase shifting layer 22. In the case of SiN material, adhesive layer 23 is deposited by a plasma enhanced chemical vapor deposition PECVD) method, while in the case of TiN and TiW materials, adhesive layer 23 is deposited by a sputtering method. Light shielding layer 24 is comprised of chromium.

Figure 4B:
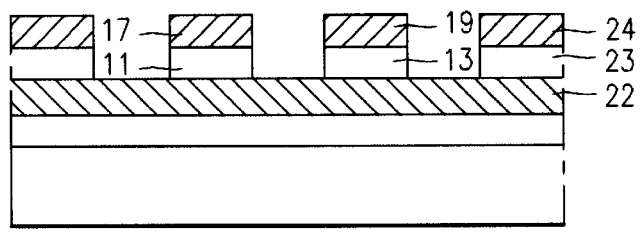

As shown in FIG. 4b, by means of photolithography and an etching process, light shielding layer 24 and adhesive layer 23 are selectively removed to expose phase shifting layer 22. In particular, both light shielding layer 24 and adhesive layer 23 are selectively removed so as to be aligned with each other.

Figure 4C:
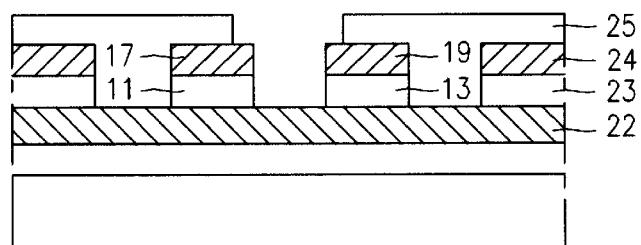
Figure 4D:
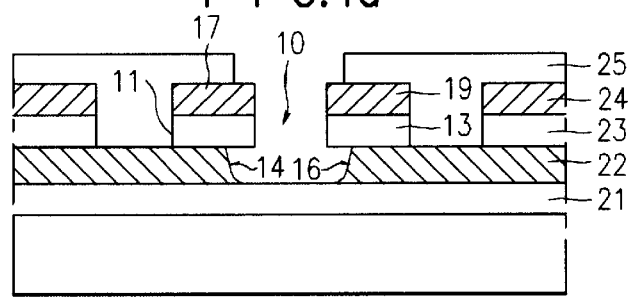

As shown in FIG. 4c, a photosensitive film 25 is coated on the entire surface of substrate 20 including light shielding layer 24, and then photosensitive film 25 is patterned by its selective removal so as to expose a shifter region. As shown in FIG. 4d, using patterned photosensitive film 25 and light shielding layer 24 as a mask, phase shifting layer 22 is selectively removed.

At this stage, phase shifting layer 22 is removed by isotropic etching. The length of time to isotropically etch phase shifting layer 22 is the amount of time required to etch light shielding layer 24 to under half of the width of light shielding layer 24 and adhesive layer 23.

For example, if phase shifting layer 22 is formed of an organic oxide, the thickness of phase shifting layer 22 may be about 3650 Å. At this point, if the pattern size of light shielding layer 24 is about 1.0 $\mu$m, phase shifting layer 22 is etched to an extent corresponding to the time required to etch it to about 5000 Å.

Figure 4E:
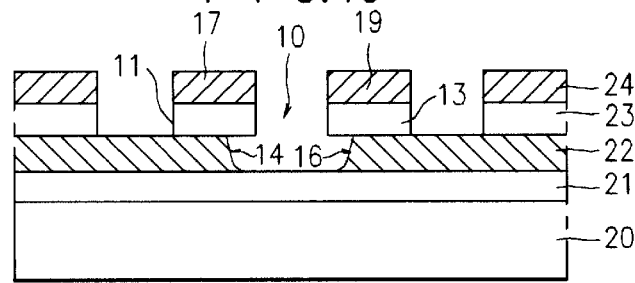

Finally, as shown in FIG. 4e, remaining photosensitive film 25 is removed to complete a phase shifting mask.

FIG. 5 is a cross-sectional view showing the structure of a phase shifting mask according to a second embodiment of the present invention. As shown in FIG. 5, the phase shifting mask is composed of a light shielding layer 24 formed with a predetermined width on a transparent substrate 20, an adhesive layer 23 formed on light shielding layer 24, and a phase shifting layer 22 formed so as to surround the entire exposed surfaces of light shielding layer 24 and adhesive layer 23. Light shielding layer 24 and adhesive layer 23 are formed so as to be aligned with each other.

Light shielding layer 24 is comprised of chromium. Adhesive layer 23 is comprised of a material selected from the group of SiN, TiN, and TiW, all of which have a different etch rate than that of phase shifting layer 22. In the case of the SiN material, adhesive layer 23 is deposited by a PECVD method, while in the case of the TiN or TiW materials, adhesive layer 23 is deposited by a sputtering method.

Phase shifting layer 22 is comprised of a material selected from the group of an oxide, a SOG, and a DLC, all of which are materials having low light-absorptivity and with which low temperature deposition is possible. If the thickness of phase shifting layer 22 is D, it is formed so as to satisfy the formula: $D=\lambda/2\cdot(n-1)$; wherein $\lambda$ is the exposure wavelength, and n is the refractive index of the phase shifting layer.

Figure 6A:
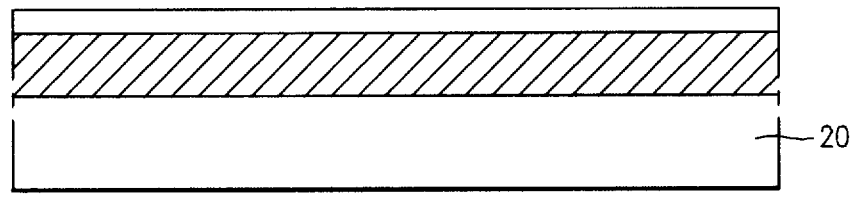
FIGS. 6a–6c are cross-sectional views illustrating a method of manufacturing a phase shifting mask in accordance with the second embodiment of the present invention.
Figure 6B:
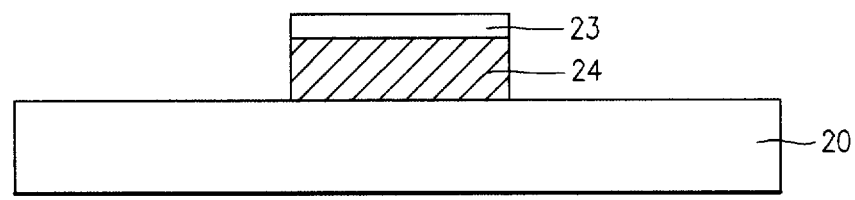
Figure 6C:
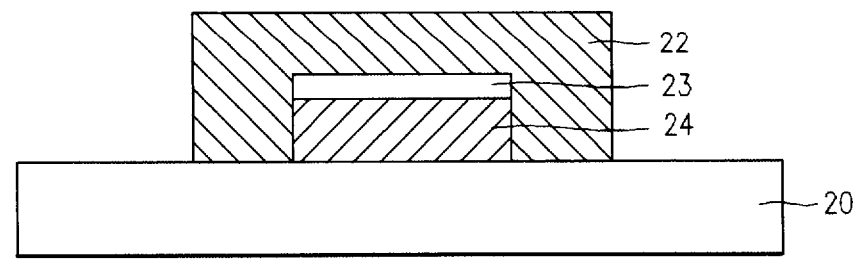

FIGS. 6a–6c are cross-sectional views illustrating a method of manufacturing a phase shifting mask according to the second embodiment of the present invention.

As shown in FIG. 6a, a light shielding layer 24 and an adhesive layer 23 are sequentially formed on a light transmitting substrate 20. Adhesive layer 23 is comprised of a material selected from the group of SiN, TiN, and TiW. In the case of SiN material, adhesive layer 23 is formed by a PECVD method, while in the case of the TiN and TiW materials, adhesive layer 23 is deposited by a sputtering method.

As shown in FIG. 6b, light shielding layer 24 and adhesive layer 23 are patterned (e.g., selectively removed) so as to form a light shielding layer pattern and an adhesive layer pattern which are aligned with each other, which have the same predetermined width, and which can be jointly considered as a light shielding layer and adhesive layer pattern.

FIG. 6c shows another stage in the process of manufacturing a phase shifting mask according to the second embodiment of the invention, in which a phase shifting layer 22 is first formed on the entire surface of substrate 20 including patterned light shielding layer 24 and patterned adhesive layer 23, and then phase shifting layer 22 is patterned (e.g., selectively removed) so as to surround the entire exposed surface of light shielding layer 24 and adhesive layer 23.

FIG. 7 is a cross-sectional view showing the structure of a phase shifting mask according to a third embodiment of the present invention. As shown in FIG. 7, the phase shifting mask is composed of a phase shifting layer 22, formed with a predetermined width on a transparent substrate 20 such as quartz or glass; an adhesive layer 23 formed on phase shifting layer 22, and having a width less than that of phase shifting layer 22; and a light shielding layer 24 formed on adhesive layer 23 and having the same width as that of adhesive layer 23. Light shielding layer 24 and adhesive layer 23 are formed so that they are aligned with each other.

Light shielding layer 24 is comprised of chromium. Adhesive layer 23 is comprised of a material selected from the group of SiN, TiN, and TiW, all of which have different etch rates than that of phase shifting layer 22. Phase shifting layer 22 is comprised of a material selected from the group of an oxide, an SOG, and a DLC, which are materials having low light-absorptivity and with which low temperature deposition is possible. If the thickness of phase shifting layer 22 is D, it is formed so as to satisfy the formula: $D=\lambda/2\cdot(n-1)$; wherein $\lambda$ is the exposure wavelength, and n is the refractive index of the phase shifting layer.

FIGS. 8a–8c are cross-sectional views illustrating a method of manufacturing a phase shifting mask according to the third embodiment of the present invention. As shown in FIG. 8a, a phase shifting layer 22 is formed on a light transmitting substrate 20, and then phase shifting layer 22 is patterned (e.g., selectively removed) to form a phase shifting layer 22 of a predetermined width.

As shown in FIG. 8b, an adhesive layer 23 and a light shielding layer 24 are then sequentially formed on substrate 20 and phase shifting layer 22. Adhesive layer 23 is comprised of a material selected from the group of SiN, TiN, and TiW. In the case of SiN material, adhesive layer 23 is deposited by a PECVD method, while in the case of the TiN and TiW materials, adhesive layer 23 is deposited by a sputtering method.

As shown in FIG. 8c, adhesive layer 23 and light shielding layer 24 are patterned so as to be aligned with each other, and so as to have a width less than that of phase shifting layer 22.

The structure and manufacturing method of the phase shifting mask according to the first embodiment of the present invention have various advantages over the prior art. Since the phase shifting layer is etched isotropically, diffraction and dispersion of light at the interface between phase shifting layer 22 and substrate 20 can be prevented. When etching phase shifting layer 22, light shielding layer 24 is protected by adhesive layer 23. Since adhesive layer 23 is formed between phase shifting layer 22 and light shielding layer 24, the adhesive strength of the phase shifting mask is increased, thereby greatly improving its reliability. Fourthly, substrate protecting layer 21, which has etchresistance to the etchant of phase shifting layer 22, is disposed between phase shifting layer 22 and substrate 20. Thus, during etching phase shifting layer 22, the surface of substrate 20 is protected, thereby enhancing the light transmittancy of substrate 20. Moreover, adhesive layer 23 supports light shielding layer 24 as it protrudes above the open region of phase shifting layer 22, thereby preventing the edge of light shielding layer 24 from being damaged.

The structure and manufacturing method of the phase shifting mask in accordance with the second embodiment of the present invention also have various advantageous. When etching phase shifting layer 22, light shielding layer 24 is protected by adhesive layer 23. Since adhesive layer 23 is formed between phase shifting layer 22 and light shielding layer 24, the adhesive strength of the phase shifting mask is increased, thereby greatly improving the reliability.

In the structure and manufacturing method of the phase shifting mask in accordance with the third embodiment of the present invention, adhesive layer 23 is formed between phase shifting layer 22 and light shielding layer 24, thereby providing increased adhesive strength and improved reliability of the phase shifting mask.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A phase shifting mask, comprising:
   a light transmitting substrate;
   a phase shifting layer formed on said light transmitting substrate;
   an adhesive layer formed on said phase shifting layer; and
   a light shielding layer formed on said adhesive layer, wherein said adhesive layer is formed between said phase shifting layer and said light shielding layer.

2. A phase shifting mask as claimed in claim 1, wherein said phase shifting layer is comprised of a material selected from the group of an oxide, a spin-on-glass, and a diamond-like carbon.

3. A phase shifting mask as claimed in claim 1, wherein said adhesive layer is comprised of a material whose etch rate is different from that of said phase shifting layer.

4. A phase shifting mask as claimed in claim 1, wherein said phase shifting layer is formed to a width wider than that of said light shielding layer.

5. The phase shifting mask of claim 1, wherein said adhesive layer is formed directly on at least one of said phase shifting layer and said light shielding layer.

6. The phase shifting mask of claim 5, wherein said adhesive layer is formed directly on at least one of said phase shifting layer and said light shielding layer.

7. A phase shifting mask, comprising:
   a light transmitting substrate;
   a substrate protecting layer formed on said light transmitting substrate;
   a phase shifting layer formed on said substrate protecting layer, said phase shifting layer having an open region therein, and said open region having first and second edge parts;
   first and second portions of an adhesive layer formed on said phase shifting layer, said first and second portions of said adhesive layer extending over said first and second edge parts, respectively, of said open region; and
   first and second portions of a light shielding layer formed on said first and second portions of said adhesive layer.

8. A phase shifting mask as claimed in claim 7, wherein said light transmitting substrate is comprised of either quartz or glass.

9. A phase shifting mask as claimed in claim 7, wherein said substrate protecting layer is comprised of a material having transmittancy to light and etch-resistance to an SOG etchant.

10. A phase shifting mask as claimed in claim 9, wherein said material having transmittancy to light and etch-resistance to an SOG etchant is either $SnO_2$ or SiN.

11. A phase shifting mask as claimed in claim 7, wherein the thickness, D of said phase shifting layer is formed so as to satisfy the formula: $D=\lambda/2\cdot(n-1)$, wherein $\lambda$ is exposure wavelength, and n is refractive index of said phase shifting layer.

12. A phase shifting mask as claimed in claim 7, wherein said adhesive layer is comprised of a material having an etch rate different from that of said phase shifting layer.

13. A phase shifting mask as claimed in claim 12, wherein said material having an etch rate different from that of said phase shifting layer is selected from the group of SiN, TiN, and TiW.

14. A phase shifting mask as claimed in claim 7, wherein said light shielding layer is comprised of chromium.

15. A phase shifting mask as claimed in claim 7, wherein said light shielding layer and said adhesive layer are formed so as to be aligned with each other.

16. The phase shifting mask of claim 7, wherein said adhesive layer is formed between said phase shifting layer and said light shielding layer.

17. The phase shifting mask of claim 16, wherein said adhesive layer is formed directly on at least one of said phase shifting layer and said light shielding layer.

18. A phase shifting mask, comprising:
a light transmitting substrate;
a light shielding layer formed on said light transmitting substrate, said light shielding layer having a predetermined width;
an adhesive layer formed on said light shielding layer; and
a phase shifting layer formed so as to surround the entire exposed surfaces of said light shielding layer and said adhesive layer.

19. The phase shifting mask of claim 18, wherein said adhesive layer is formed between said phase shifting layer and said light shielding layer.

20. A method of manufacturing a phase shifting mask, comprising the steps of;
preparing a transmitting substrate;
sequentially forming a substrate protecting layer, a phase shifting layer, an adhesive layer and a light shielding layer on said substrate;
patterning said light shielding layer and said adhesive layer to form a plurality of patterns spaced apart from one another; and
patterning said phase shifting layer to form a plurality of phase shifting layer patterns.

21. A method of manufacturing a phase shifting mask as claimed in claim 20, wherein said adhesive layer is comprised of a material selected from the group of SiN, TiN, and TiW.

22. A method of manufacturing a phase shifting mask as claimed in claim 21, wherein said SiN material is deposited by a PECVD method, and wherein said TiN and TiW materials are deposited by a sputtering method.

23. A method of manufacturing a phase shifting mask as claimed in claim 20, wherein said pattern in said phase shifting layer is formed by isotropic etching.

24. A method of manufacturing a phase shifting mask as claimed in claim 23, wherein the isotropic etching amount of said phase shifting layer is etched to under half of the width of said light shielding layer.

25. A method of manufacturing a phase shifting mask as claimed in claim 23, wherein said isotropic etching of said phase shifting layer forms an open region in said phase shifting layer, and wherein said isotropic etching is performed to an extend wherein said open region in said phase shifting layer has a width less than half of the width of said first and second portions of said light shielding layer.

26. The method of claim 20, wherein said adhesive layer is formed between said phase shifting layer and said light shielding layer.

27. The method of claim 26, wherein said adhesive layer is formed directly on at least one of said phase shifting layer and said light shielding layer.

28. A method of manufacturing a phase shifting mask, comprising the steps of:
preparing a transmitting substrate;
sequentially forming a light shielding layer and an adhesive layer on said substrate;
patterning said light shielding layer and said adhesive layer to form a pattern with a predetermined width;
forming a phase shifting layer on the entire surface of said substrate including said pattern; and
patterning said phase shifting layer to form a phase shifting layer pattern surrounding the exposed entire surface of said pattern of said light shielding layer and said adhesive layer.

29. The method of claim 28, wherein said adhesive layer is formed between said phase shifting layer and said light shielding layer.

30. The method of claim 29, wherein said adhesive layer is formed directly on at least one of said phase shifting layer and said light shielding layer.

31. A method of manufacturing a phase shifting mask, comprising the steps of:
preparing a transmitting substrate;
forming a phase shifting layer on said substrate;
patterning said phase shifting layer to form a pattern with a predetermined width;
sequentially forming an adhesive layer and a light shielding layer on the entire surface of said substrate including said pattern; and
patterning said adhesive layer and said light shielding layer so as to have a width smaller than that of said phase shifting layer, wherein said adhesive layer is formed between said phase shifting layer and said adhesive layer.

32. The method of claim 31, wherein said adhesive layer is formed directly on at least one of said phase shifting layer and said light shielding layer.

33. A method of manufacturing a phase shifting mask, comprising the steps of:
providing a light transmitting substrate;
sequentially forming a substrate protecting layer, a phase shifting layer, an adhesive layer, and a light shielding layer on said light transmitting substrate;
selectively removing said light shielding layer and said adhesive layer to form a pattern within said light shielding layer and said adhesive layer, wherein said pattern within said light shielding layer and said adhesive layer comprises first and second portions of said light shielding layer and of said adhesive layer; and
selectively removing said phase shifting layer to form a pattern in said phase shifting layer, wherein said adhesive layer is formed between said phase shifting layer and said adhesive layer.

34. The method of claim 33, wherein said adhesive layer is formed directly on at least one of said phase shifting layer and said light shielding layer.

35. A method of manufacturing a phase shifting mask, comprising the steps of:
providing a light transmitting substrate;

sequentially forming a light shielding layer and an adhesive layer on said light transmitting substrate;

selectively removing said light shielding layer and said adhesive layer to form a light shielding layer and adhesive layer pattern having a predetermined width;

forming a phase shifting layer on the entire surfaces of said light transmitting substrate and said light shielding layer and adhesive layer pattern; and selectively removing said phase shifting layer to form a phase shifting layer pattern, wherein said phase shifting layer pattern surrounds the entire exposed surfaces of said light shielding layer and adhesive layer pattern.

36. The method of claim 35, wherein said adhesive layer is formed between said phase shifting layer and said light shielding layer.

37. The method of claim 36, wherein said adhesive layer is formed directly on at least one of said phase shifting layer and said light shielding layer.

38. A method of manufacturing a phase shifting mask, comprising the steps of:

providing a light transmitting substrate;

sequentially forming a light shielding layer and an adhesive layer on said light transmitting substrate;

selectively removing said light shielding layer and said adhesive layer to form a light shielding layer and adhesive layer pattern having a predetermined width;

forming a phase shifting layer on the entire surfaces of said light transmitting substrate and said light shielding layer and adhesive layer pattern; and selectively removing said phase shifting layer to form a phase shifting layer pattern, wherein said phase shifting layer pattern surrounds the entire exposed surfaces of said light shielding layer and adhesive layer pattern.

39. The method of claim 38, wherein said adhesive layer is formed between said phase shifting layer and said light shielding layer.

40. The method of claim 39, wherein said adhesive layer is formed directly on at least one of said phase shifting layer and said light shielding layer.

\* \* \* \* \*